Feb. 7, 1961 W. D. COCKRELL 2,971,134
PHOTOTRANSISTOR OPERATED RELAY
Filed Oct. 29, 1958
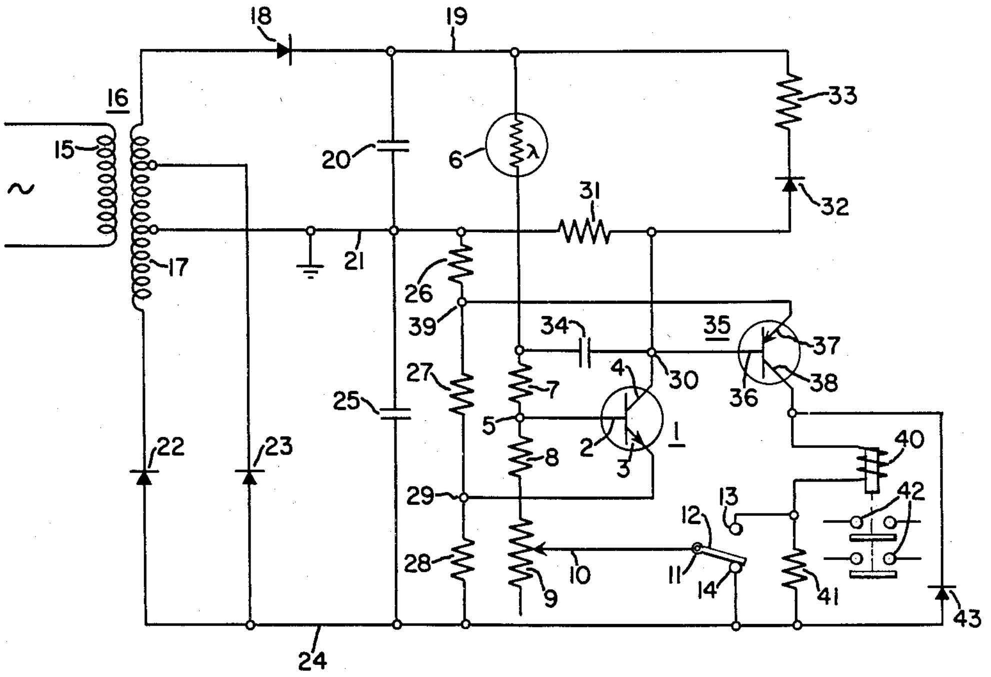
INVENTOR:
WILLIAM D. COCKRELL,
BY Melvin M. Goldenberg
HIS ATTORNEY.

2,971,134
Patented Feb. 7, 1961

2,971,134

PHOTOTRANSISTOR OPERATED RELAY

William D. Cockrell, Waynesboro, Va., assignor to General Electric Company, a corporation of New York Filed Oct. 29, 1958, Ser. No. 770,339

6 Claims. (Cl. 317—124)

This invention relates to a novel control circuit utilizing junction transistors which is effective to control a suitable load in response to a changing condition of light on a photosensitive device.

In order to utilize photosensitive conductive devices and semiconductor amplifiers in control circuits, there are several problems which must be considered. One of these is that it is desirable to provide that the control signal or current through the photosensitive device be of a relatively low order of magnitude in order to stay within the limits of the devices available. This requires that if the control signal is to be amplified by transistors, it is therefore desirable that the amplifiers present a relatively high input impedance and high gain in order that the signal may be raised to a usable level. Also, if the signal is to be used to control typical loads such as electromagnetic relays, it is necessary that the current be amplified a considerable amount in order to reach the levels necessary for the operation of such loads. It is well-known that transistors of the NPN variety while having the characteristic of relatively high input impedances do not usually have the voltage handling capacity necessary to provide a control signal of a usable order of magnitude. Further, the typical PNP transistor while presenting a relatively high forward impedance, usually has a relatively high voltage handling capacity and is therefore capable of providing control signals of a usable order of magnitude.

Therefore, it is an object of this invention to provide a novel control circuit which is responsive to changing conditions of light and utilizes in combination a pair of complementary transistors to provide a sensitive circuit and, at the same time, one capable of furnishing the signal of a magnitude sufficient to control a load.

It is another object of this invention to provide a novel control circuit responsive to changing conditions of light which utilizes an NPN transistor in a first stage of amplification to provide a sensitive device and a PNP transistor in a second stage of amplification to provide that the amplified control signal be of a usable level.

In addition to the requirements that a light sensitive control circuit be of some sensitivity and supply a usable control signal, it is desirable in many instances that the circuit respond rapidly to the change of the light impressed thereon. Therefore, it is another object of this invention to provide a novel control circuit utilizing complementary transistors together with a connection between the two transistors to provide a positive feedback from the output of one of the transistors to the input of the other so that a snap action is provided in the circuit.

It is a further object of this invention to provide a novel control circuit utilizing a light sensitive device in conjunction with a pair of complementary transistors connected in cascade and including a feedback loop from the output of the second transistor to the input of the first transistor in order to provide a fast time response to a change in the light condition imposed on the circuit.

Briefly, the objects of this invention are achieved in one embodiment by the provision of a pair of complementary transistors normally biased into one state of conduction. A light sensitive device is provided between a source of unidirectional potential and the input circuit of one of the transistors to change the one transistor into another state of conduction in response to a change in the condition of light. The second transistor is connected so as to be responsive to changes in conduction of the first transistor. Also provided is a feedback from the output circuit of the second transistor to the input circuit of the first transistor effective to change the relative biases on the first transistor to increase the rate of change in conduction state in response to the change in conduction state of the second transistor. A suitable load such as an electromagnetic relay is provided to be controlled by the output circuit of the second transistor.

The features of my invention which I believe to be novel are set forth with particularity in the appended claims. My invention itself, however, both as to its organization and method of operation together with further objects and advantages thereof may best be understood by reference to the following description taken in connection with the accompanying drawing, in which:

The single figure of the drawing illustrates schematically a preferred embodiment of the invention.

My invention is illustrated as being constituted by a first transistor 1 having a base electrode 2, an emitter electrode 3 and a collector electrode 4. The base electrode 2 is connected to a junction 5 of a voltage divider constituted by a light sensitive variable impedance device 6 in series with resistors 7 and 8, and an adjustable resistor 9, the slider 10 of which is connected to a terminal 11 of a single pole switch 12 engageable with either a contact 13 or a contact 14. This voltage divider is connected across a means for supplying unidirectional potential which is illustrated as a power supply energized from an alternating current source connected to the primary winding 15 of a transformer 16 having a secondary 17. A rectifying device 18 is connected at one end of a secondary winding 17 and is poled to provide a positive potential on the conductor 19. The positive potential appearing on the conductor 19 is filtered by a capacitor 20 connected between the conductor 19 and a conductor 21 which constitutes a neutral or ground conductor and is returned to a tap on the secondary winding 17. Also connected to the secondary winding 17 are a pair of rectifying devices 22 and 23 which provide a negative unidirectional potential on the conductor 24 which is filtered by a capacitor 25 connected between the conductor 24 and the ground or neutral conductor 21.

In order to provide bias voltages for the transistor amplifier circuit, a voltage divider constituted by the resistors 26, 27 and 28 is connected across the conductors 24 and 21. The operating biases for the transistor 1 are provided by connecting the emitter electrode 3 to a junction 29 between the resistances 27 and 28. The collector electrode 4 of the transistor 1 is connected to a junction point 30 and from thence to the conductor 21 between a resistor 31 and a unilateral conducting device 32 connected by a resistor 33 to the conductor 19.

A second stage of signal amplification is provided by a transistor 35 having a base electrode 36, an emitter electrode 37 and a collector electrode 38. The emitter electrode 37 is connected to a junction 39 between the resistors 26 and 27 while the collector electrode 38 is connected through an actuating winding 40 of an electromagnetic relay and a resistor 41 to the negative conductor 24. The junction of the actuating winding 40 and the resistor 41 is connected to the contact 13 of the switch 12. As an example of the contact arrangement which may be controlled by the electromagnetic relay, the drawing illustrates a pair of normally open contacts 42 which are mechanically connected to the armature (not shown) of the relay. Connected in parallel with the relay winding 40 and resistor 41 is a unilateral conducting device 43.

In order that the operation of this apparatus may be understood, it is deemed desirable to trace the various circuits appearing therein. Thus it may be seen that the light responsive variable impedance device 6 in conjunction with the resistances 7 and 8 and a segment of the resistance 9, constitute a voltage divider which has a positive voltage applied at one end and a negative voltage at the other end thereof. In perfect darkness, the device 6 has an extremely high resistance and may be considered an open circuit. As light strikes the device 6, its resistance is decreased and the current flow through the voltage divider increases. However, under conditions of no light on the device 6 the voltages across the resistors 7, 8 and 9 are relatively negative so that a negative voltage is applied to the base electrode 2 of the transistor 1. A relatively negative voltage is also supplied across the voltage divider constituted by the resistors 26, 27 and 28. Inasmuch as the emitter electrode 3 of the transistor 1 is connected to the junction point 29, a negative voltage is imposed thereon. The relative voltages appearing on the conductors 19 and 24 and the sizes of the resistances 7, 8 and 9 and 26, 27 and 28 are selected so that in the normal or quiescent state the base electrode 2 is negative with respect to the emitter electrode 3 and the transistor 1 is therefore in a first state of conduction; that is, one wherein the only current flow will be that made up of leakage current which is of a value dependent upon the ambient temperature and may be considered negligible.

Directing attention now to the transistor 35, it may be seen that its emitter 37 is connected to the junction 39 and therefore has a negative potential imposed thereon. The base electrode 36 of this transistor, as may be seen, is connected to the ground conductor 21 through the resistor 31 and therefore has a positive potential imposed thereon. Inasmuch as the transistor 35 is illustrated as being of the PNP variety, the base is positive with respect to the emitter and this transistor is therefore in a first state of conduction wherein no current flows except again for leakage current, which is negligible. Under these circumstances, there is no collector to emitter current flow and the relay winding 40 is therefore de-energized and the contacts 42 are in the normally opened position illustrated.

When light is applied to the photoresponsive devices 6, the resistance thereof decreases and a current flow exists through the voltage divider of which it is a part. This current flow is a function of the amount of light and the setting of the slider 10 on the resistance 9. When this slider is in such a position that a maximum amount of resistance is included in the voltage divider, less light is required to produce a given voltage drop than when it is in its extreme position in the other direction. As stated above, in the quiescent state both the emitter 3 and base 2 have negative voltages imposed thereon with the base electrode 2 being more negative than the emitter electrode 3. As the voltage on the junction 5 moves in a positive direction, a value of voltage will be reached which, while still relatively negative, will make the base electrode 2 more positive than the emitter electrode 3 and the transistor 1 will begin to conduct. The conduction of the transistor 1 produces a voltage drop across the resistor 31 which is directly coupled to the base electrode 36 of the transistor 35. This causes the voltage imposed on the base electrode 36 to be lowered or moved in a negative direction which therefore goes negative with respect to the emitter electrode 37 so that the transistor 35 will begin to conduct in a circuit constituted by the resistor 41, relay winding 40, collector 38, emitter 37 to the junction point 39 and resistor 26 to the conductor 21. The additional current flow through the resistor 26 provides a positive feedback by lowering the bias voltage at the junction 29 so as to make it more negative. Thus the base electrode 2 of the transistor 1 becomes more positive with respect to the emitter electrode 3 causing, in turn, a greater collector to emitter current of the transistor 1 thereby further increasing the conduction of the transistor 35. This results in a suddent snap action once conduction begins in transistor 1. In order to provide temperature stabilization of the circuit, the resistor 33 and rectifying device 32 are connected in series from the positive supply conductor 19 to the collector 4 of the transistor 1. The rectifying device 32 is chosen to be one fabricated out of the same semiconducting material as that out of which the transistor 1 is fabricated so that it exhibits similiar leakage current versus temperature characteristics. Therefore, as the collector current of the transistor 1 increases with temperature under cut-off conditions, this current is compensated by a leakage through the rectifier 32 and the voltage at the junction 30 changes very little with temperature. Also, to protect the transistor 35 from excessive values of negative current created due to the inductive reactance when the current through the relay winding 40 is cut off, the rectifier 43 provides a shunt path for such currents.

The capacitor 34 connected between the collector electrode 4 of the transistor 1 and its base electrode 2 functions to eliminate any ripple which may exist in the voltage appearing across the voltage divider constituted by the device 6 and resistances 7, 8 and 9, and also functions to prevent any internal circuit oscillations to thereby insure stability of the circuit. The switch 12, when engaged with the contact 14, provides a direct path between the slider 10 and the conductor 24. When the switch 12 engages the contact 13, the slider 10 is connected to the conductor 24 through the resistor 41. Under this condition, and when the relay winding 40 is energized, current through the resistor 41 provides a voltage drop which increases the conductivity through the first transistor 1. Thus, the snap action mentioned above is further improved.

As illustrated and described, this embodiment of the invention contemplates a circuit wherein the relay winding 40 is deenergized in the absence of light on the device 6. It is obvious that by reversing the potentials applied to the input voltage divider constituted by the light sensitive device 6 and resistances 7, 8 and 9, the biases on the transistors 1 and 35 will be such that they are in a conducting state and the actuating winding 40 energized to have the relay picked up to be dropped out as the light on the device 6 increases.

While the invention has been described by reference to a particular embodiment thereof, it will be understood that numerous modifications may be made by those skilled in the art without departing from the invention. I therefore aim, in the appended claims, to cover all such equivalent variations as come within the true spirit and scope of my invention.

What I claim as new and desire to secure by Letters Patent of the United States is:

1. A control circuit comprising an NPN transistor having base, collector and emitter electrodes, a source of unidirectional potential, a first voltage divider connected across said source, said first voltage divider including a photosensitive variable impedance, said base of said NPN transistor being connected to said source through said first divider so as to have a first value of negative potential imposed thereon, a second voltage divider connected across a portion of said source, said emitter of said NPN transistor being connected to said second voltage divider so as to have a second and less negative potential imposed thereon, means connecting said collector of said NPN transistor to said source to impose a potential thereon more positive than the potential imposed on said emitter, a PNP transistor having base, collector and emitter electrodes, means connecting said base electrode of said PNP transistor to said collector electrode of said NPN transistor, said emitter electrode of said PNP transistor being connected to said second voltage divider at a point less negative than the point of connection of said emitter of said NPN transistor, and a relay having an actuating winding, said actuating winding being connected to said collector electrode of said PNP transistor and to a negative terminal of said source.

2. A control circuit comprising a first voltage divider, a second voltage divider, means for imposing a potential on said first voltage divider which is negative with respect to ground and a potential on said second voltage divider whereby said second voltage divider has a positive potential at one end thereof and a negative potential at the other end thereof, said second voltage divider including a light responsive variable impedance means connected to the positive potential end thereof, an NPN transistor having base, collector and emitter electrodes, means connecting said base electrode of said NPN transistor to said second voltage divider at a point remote from the connection of said light responsive variable impedance means to said positive potential end to impose a negative potential thereon, means connecting said emitter electrode to said first voltage divider at a point whereby a negative potential less than that imposed on said base electrode will be imposed on said emitter electrode to maintain said NPN transistor in a non-conducting state, means connecting said collector electrode of said NPN transistor to an end of said first voltage divider, a PNP transistor having base, collector and emitter electrodes, means connecting said base electrode of said PNP transistor to said collector of said NPN transistor, a relay having an actuating winding, means connecting said actuating winding between said collector of said PNP transistor and the most negative end of said first voltage divider, and means connecting said emitter electrode of said PNP transistor to a point on said first voltage divider to impose a voltage thereon which is negative with respect to the voltage imposed on the base thereof to normally maintain said PNP transistor in a non-conducting state and to cause said emitter of said NPN transistor to become less positive when said PNP transistor conducts.

3. A control circuit comprising an NPN transistor having base, collector and emitter electrodes, a source of unidirectional potential, means connected to two electrodes of said NPN transistor and said source to maintain said transistor in a non-conducting state, means connecting the third electrode of said NPN transistor to said source, a light responsive variable impedance device connected between said source and one of said two electrodes to cause said NPN transistor to conduct in response to increasing light on said device, a PNP transistor having base, collector and emitter electrodes, means connected to said source and to two electrodes of said PNP transistor to normally maintain said PNP transistor in a non-conducting state, means connecting one of said two electrodes of said PNP transistor to said third electrode of said NPN transistor to cause said PNP transistor to conduct in response to conduction of said NPN transistor, a relay having an actuating winding, means connecting said actuating winding in circuit with said PNP transistor to cause said actuating winding to be energized in response to conduction of said PNP transistor, and feedback means connected between said PNP transistor and said NPN transistor to cause the conduction of said NPN transistor to increase in response to conduction of said PNP transistor.

4. A control circuit comprising an NPN transistor having input and output electrodes, a source of unidirectional potential, means connecting said input electrodes of said NPN transistor to said source to maintain said transistor in a non-conducting state, a light responsive variable impedance device, means connecting said device to said source and said input electrodes to cause said NPN transistor to conduct in response to increased light, a PNP transistor having input and output electrodes, means connecting said input electrodes of said PNP transistor to said source to maintain said PNP transistor in a non-conducting state, means connecting said input electrodes of said PNP transistor to said output electrodes of said NPN transistor to cause said PNP transistor to conduct in response to conduction of said NPN transistor, a relay having an actuating winding, means connecting said actuating winding to said source and to said output electrodes of said PNP transistor to cause said winding to be energized in response to conduction of said PNP transistor, and means connecting said output electrodes of said PNP transistor to said input electrodes of said NPN transistor to cause said NPN transistor to conduct more in response to conduction of said PNP transistor.

5. A control circuit comprising a pair of complementary transistors each having input and output electrodes, means for supplying unidirectional potential, a circuit connecting said means and said input electrodes of a first of said transistors to maintain said first transistor in a non-conducting state, a light responsive variable impedance device connected between said input electrodes of said first transistor and said means to cause said first transistor to conduct in response to increased light on said device, a circuit connecting said means and said input electrodes of a second of said transistors to maintain said second transistor in a non-conducting state, said input electrodes of said second transistor being connected to said output electrodes of said first transistor whereby said second transistor will conduct in response to conduction of said first transistor, a relay having an actuating winding, said actuating winding being connected to said output electrodes of said second transistor and to said means to be energized in response to conduction of said second transistor, and said output electrodes of said second transistor being connected to said input electrodes of said first transistor to provide positive feedback to increase conduction of said first transistor in response to conduction of said second transistor.

6. A control circuit comprising a pair of complementary transistors, means for supplying unidirectional potential, said transistors being connected to said means and biased thereby to be maintained in a first state of conduction, a light responsive device connected between said means and one of said transistors to cause said one transistor to be biased into another state of conduction in response to a change of condition of light on said device, means connecting said one transistor to the other of said transistors to cause said other transistor to be biased into a corresponding state of conduction when said one transistor is biased into said another state of conduction, a current responsive load device connected to said other transistor whereby the energization condition of said load device is responsive to the state of conduction of said other transistor, and means connecting said other transistor to said one transistor to provide a positive feedback to said one transistor.

References Cited in the file of this patent

UNITED STATES PATENTS

| | | |
|---|---|---|
| 2,840,727 | Guggi | June 24, 1958 |
| 2,879,456 | Pinckaers | Mar. 24, 1959 |

OTHER REFERENCES

Penfield: "Radio and Television News," August 1955, pages 56, 57 and 122.